US005861702A

United States Patent [19]

Bishop et al.

[11] Patent Number: 5,861,702

[45] Date of Patent: Jan. 19, 1999

[54] PIEZOELECTRICALLY ACTUATED GROUND FAULT INTERRUPTER CIRCUIT APPARATUS

[76] Inventors: Richard Patten Bishop, P.O. Box 10495, Burke, Va. 22009; Bradley D. Goldizen, 716 Villa Dr., Chesapeake, Va. 23320; Stephen Earl Clark, 1344 Monterey Ave., Norfolk, Va. 23508

[21] Appl. No.: 813,880

[22] Filed: Mar. 7, 1997

[51] Int. Cl.$^{6}$ .................................................... H01L 41/08

[52] U.S. Cl. ......................... 310/330; 310/317; 310/358; 310/332

[58] Field of Search .................................... 310/313, 314, 310/317, 369, 358, 330, 371, 331, 332; 361/93

[56] References Cited

U.S. PATENT DOCUMENTS 4,042,967 8/1977 Yamamoto ................................ 361/45
4,473,859 9/1984 Stone et al. ................................ 361/93
5,589,725 12/1996 Haertling ................................ 310/358

*Primary Examiner*—Mark O. Budd
*Assistant Examiner*—Timothy A. Williams
*Attorney, Agent, or Firm*—Stephen E. Clark

[57] ABSTRACT

A ground fault interrupter circuit ("GFIC") device having as a switching device a flextensional electroactive transducer which, when energized, opens a supply conductor between a current source and a load. When a fault current is detected a voltage is induced in a coil; due to the condition that there is less current running through the conductor from the load than through the conductor from the power supply which both extend through the core of the coil. The voltage induced in the coil is amplified by a transistor which causes the transducer to piezoelectrically "snap" from a first neutral position to a second neutral position thereby cutting of current from the power supply to the load.

13 Claims, 6 Drawing Sheets

PIEZOELECTRICALLY ACTUATED GROUND FAULT INTERRUPTER CIRCUIT APPARATUS

BACKGROUND OF THE INVENTION

1. Field of Invention

The present invention relates generally to asymmetrically stress biased piezoelectric and electrostrictive devices having integral electrodes and, more particularly, to the use of these devices in a ground fault interrupter circuit.

2. Description of the Prior Art

Electricity is the most prevalent source of energy used throughout the industrialized world, today. Problems, do however, arise if a person comes into contact with an energized conductor and his body becomes a short circuit to ground. Currents of less than 15 milliamps have been known to interrupt the electrical impulses controlling the heart muscle, and cause the heart to fibrillate, resulting in death.

Ground fault interrupter circuits, "GFICs", protect people from the harmful effects of short circuits by detecting the difference between the current delivered to, and the current returning from, a resistive load. When the amount of current returning on the neutral or grounded conductor is less than the current delivered to the load a ground fault condition occurs. If a GFIC is between the ground fault condition and the supply, the GFIC will open the circuit and prevent injury to anyone or anything that has become a path to ground.

In prior GFICs solenoids are typically used to open the circuit when a ground fault condition is present. A core, which is connected to a solenoid, measures the difference between the supply and returning currents. In a non-ground fault condition, (i.e. normal operating condition), the difference between the supply and return currents is zero. Therefore, the magnitude of the magnetic flux created by the supply current cancels out the magnitude of the magnetic flux created by the return current, resulting in no voltage being induced on the core. When a ground fault condition occurs, the supply current is greater than the return current. Consequently, the magnitude of the magnetic flux created by the supply current exceeds that of the magnetic flux created by the return current and a voltage is induced on the core. The induced core voltage energizes the solenoid. The energized solenoid produces a magnetic field which disengages the solenoid's plunger and opens the supply conductor, thus cutting the supply voltage to the ground fault condition.

Problems may arise when magnetic sensitive equipment is used near prior solenoid-actuated GFICs when they are tripped. Even though the magnetic fields produced within the core and the solenoid expand and collapse almost instantaneously, they are powerful and may damage memory storage devices such as "floppy" disks. Problems may also occur in prior GFICs if dust shorts the solenoid's windings, resulting in an insufficient voltage to disengage the plunger. Dust may also prevent the plunger from fully disengaging, thus rendering the GFIC ineffective.

Another typical problem associated with solenoid type GFICs is their inability to be used near equipment, such as transformers, which produce powerful magnetic fields. Powerful magnetic fields can cause the plunger to be inadvertently disengaged, thus cutting the supply voltage when a ground fault condition does not exist.

SUMMARY OF THE INVENTION

Accordingly, it is a primary object of the present invention to provide a ground fault interrupter circuit ("GFIC") device comprising a flextensional ferroelectric and/or ferrostrictive transducer which, when energized, opens a supply conductor between a current source and a load.

It is another object of the present invention to provide a GFIC device of the character described wherein the flextensional ferroelectric or ferrostrictive transducer comprises an active element which has two distinctive neutral (e.g. stable) configurations/positions to which the transducer may alternatively return whenever electrical power (input) to the active element is turned off.

It is another object of the present invention to provide a GFIC device of the character described wherein the transducer comprises a ceramic element bonded to a pre-stress layer, wherein the pre-stress layer applies a compressive stress to the ceramic element at all positions within the range of positions between the two distinctive neutral configurations/positions, inclusive.

It is another object of the present invention to provide a GFIC device of the character described wherein there exists a toggle plane, disposed between the two distinctive neutral configurations/positions of the active element, such that whenever electrical power input to the active element is turned off, the transducer is biased to assume the closest neutral configuration/position.

Further objects and advantages of this invention will become apparent from a consideration of the drawings and ensuing description thereof.

DESCRIPTION OF THE PREFERRED EMBODIMENT

Figure 1:
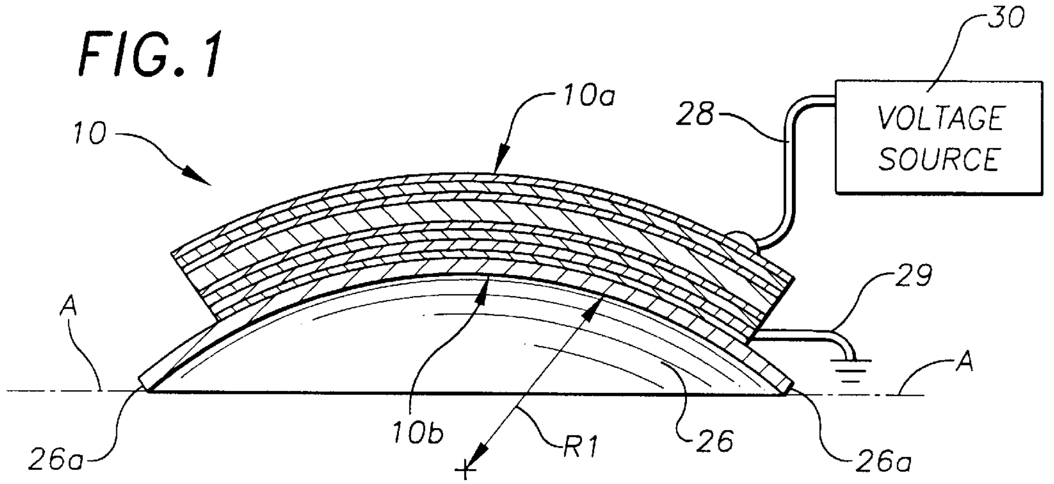
FIG. 1 is a medial cross-sectional view of the snap-action transducer used in the present invention, shown in a first neutral position.

The present invention is a ground fault interrupter circuit device ("GFIC"), generally designated 70 in the drawings. As will be more fully described below the GFIC 70 comprises a snap-action ferroelectric transducer (generally designated 10 in the drawings) which piezoelectrically "snaps" from a first neutral (i.e. stable) position to a second neutral position when energized by, or in response to, a detected fault current. When the transducer snaps into the second neutral position, it advantageously opens a circuit from a power supply, thereby interrupting the flow of electricity from the power supply through the circuit.

Snap-Action Transducer

With initial reference to FIGS. 1–5, first will be described the preferred construction and operation of a snap-action transducer 10 which may be used as a component of the a GFIC constructed in accordance with the present invention.

Figure 2:
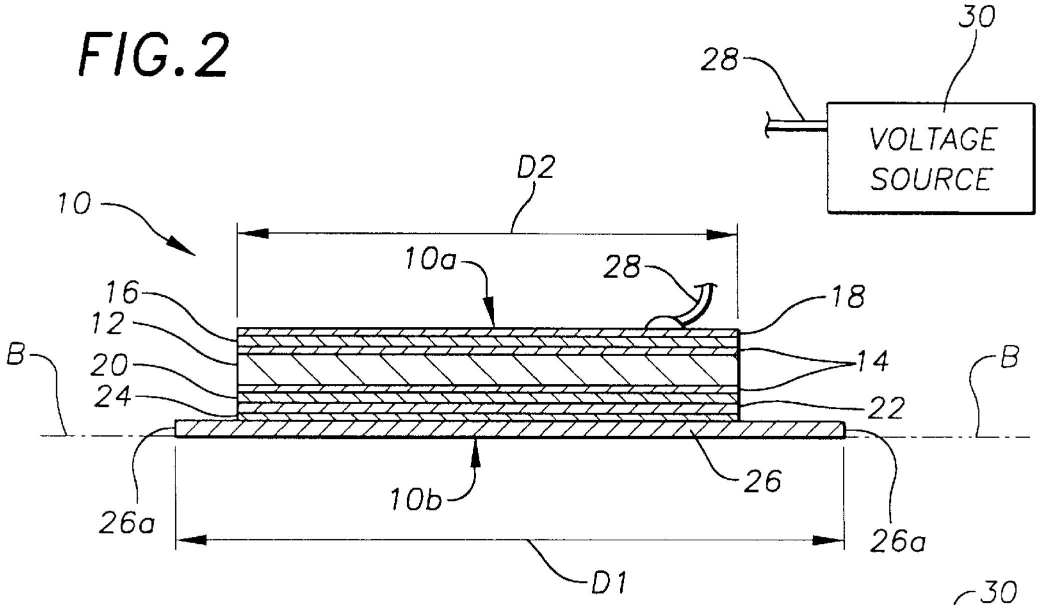
FIG. 2 is a medial cross-sectional view of the transducer used in the present invention, shown with the active element aligned with a toggle plane.
Figure 4:
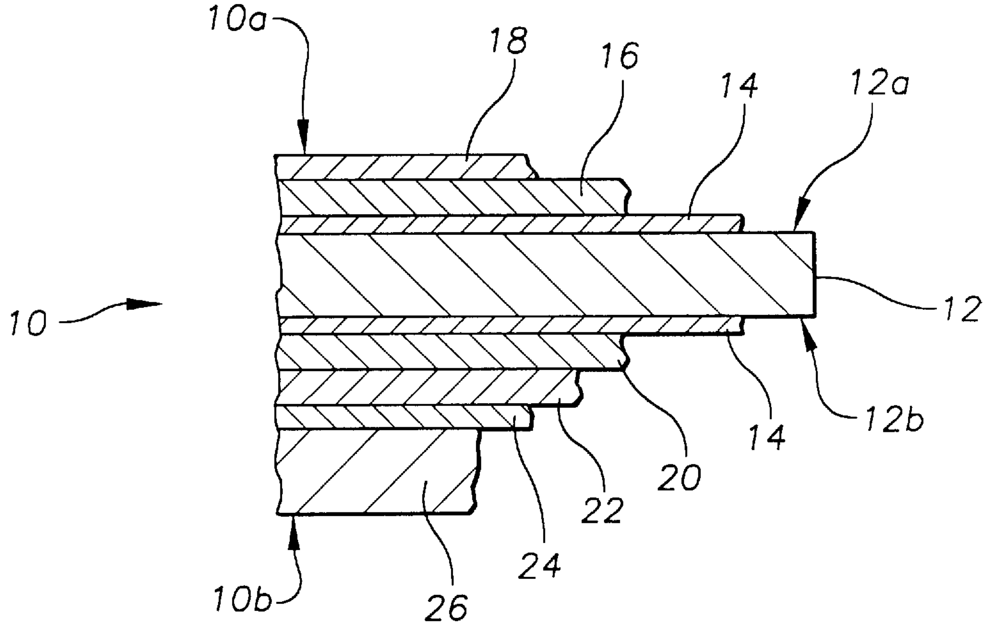
FIG. 4 is a partial cross-sectional view showing the details of construction of the various laminated layers of the transducer used in the present invention.

As illustrated in FIGS. 2 and 4, an initially disc-shaped electroactive element 12 is electroplated 14 on its two major surfaces 12*a* and 12*b*. Adjacent one of the electroplated 14 surfaces of the electroactive element 12 is a first adhesive layer 16, (preferably LaRC-SI™ adhesive, as developed by NASA-Langley Research Center and commercially marketed by IMITEC, Inc. of Schenectady, N.Y.). Adjacent the first adhesive layer 16 is a circular-shaped first aluminum layer 18 which preferably forms the outside surface on one major face 10*a* of the transducer 10. A second adhesive layer 20 (also preferably LaRC-SI™ adhesive, as developed by NASA-Langley Research Center and commercially marketed by IMITEC, Inc. of Schenectady, N.Y.) is between a second aluminum layer 22 and the electroplated surface 14 on the second major surface 12*b* of the electroactive element 12. A third adhesive layer 24 is between the second aluminum layer 22 and a circular-shaped spring member 26.

In the preferred embodiment of the invention the electroactive element 12 is a piezoelectric material such as a PZT ceramic. By way of example, in the preferred embodiment of the invention the electroactive element's diameter is determined by the ampacity rating of the GFIC in which the element is to be installed. The electroactive element's 12 diameter may be determined using the following equations.

$$R=V/I=\text{rho}\ (l/A)$$

where

R=resistance;

V=voltage;

I=current;

rho=resistivity constant of the electrode material;

l=length of the electrode;

A=cross-sectional area of the electrode.

Typically, the electroactive element 12 has a thickness of between 0.010 and 0.050 inches; the first aluminum layer 18 has a thickness of between 0.005 and 0.010 inches; the second aluminum layer has a thickness of between 0.005 and 0.010 inches; and the spring member has a thickness of between 0.010 and 0.050 inches. Electrical wires 28 are connected to the aluminum layers 18 and 22 on opposite sides of transducer 10 and to a ground-fault dependent voltage source 30. The spring member 26 preferably is made of a metal of high elasticity, such as spring steel, which has a greater coefficient of thermal contraction than does the electroactive element 14.

During manufacture of the transducer 10 the electroactive element 14, the adhesive layers 12, 14 and 24, the two aluminum layers 18 and 22, and the spring member 26 are simultaneously heated to a temperature above the melting point of the adhesive material, and subsequently allowed to cool, thereby re-solidifying and setting the adhesive layers 16 and 20 and bonding them to the adjacent layers. During the cooling process the electroactive layer 12 becomes compressively stressed due to the relatively higher coefficients of thermal contraction of the materials of construction of the two aluminum layers 18 and 22 and the spring member 26 than for the material of the electroactive element 12. Also, due to the greater coefficient of thermal contraction of the combined laminate materials (e.g. second aluminum layer 22, the second and third adhesive layers 22 and 24, and the spring member 26) on one side of the electroactive element 12 than the laminate materials (e.g. the first adhesive layer 66 and the first aluminum layer) on the other side of the electroactive element 12, the laminated structure deforms into a normally dome shape such that the outer surface 10*b* of the transducer on one side of the transducer 10 is concave and the outer surface 10*a* on the other side of the transducer 10 is convex, as illustrated in FIG. 1.

In the preferred method of manufacturing the transducer, pressure is applied to the stacked laminate layers during the heating process (e.g. by a mechanical press, or by exposing the stacked laminate layers to a increased barometric/ambient pressure, etc.) in order to enhance the integrity of the adhesion of the various laminate layers to each other. However, it is within the scope of the present manufacturing method to construct a snap action transducer substantially as described without exposing the laminate layers to outside pressure during the heating step of the manufacturing process.

Figure 5:
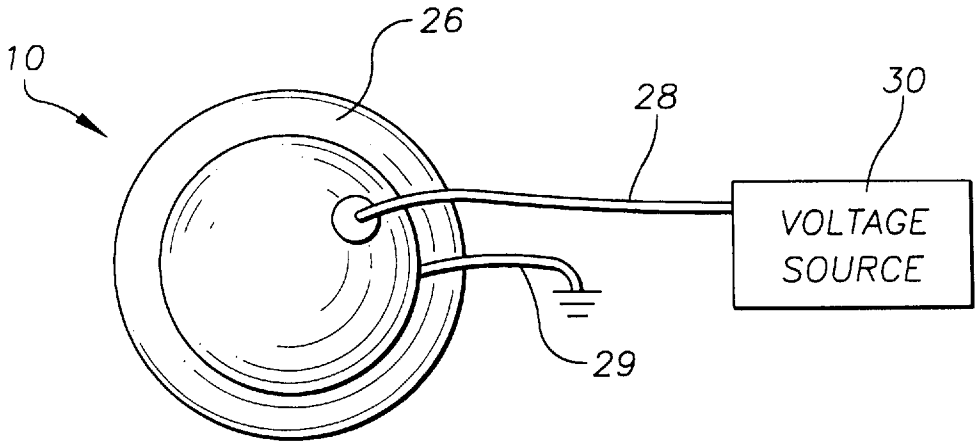
FIG. 5 is a plan view of the transducer used in the present invention.

Referring now to FIGS. 1 and 5: After the snap-action ferroelectric transducer 10 has been constructed in accordance with the foregoing process, the transducer 10 normally assumes a dome shape having an exposed concave surface 10*b* formed by the spring member 26. If no voltage is applied to the two electroplated surfaces 14 of the electroactive element 12 the transducer is biased to remain in this configuration/shape (i.e. having a convex face 10*b* on the exposed surface of the spring member 26) as illustrated in FIG. 1. This configuration/shape is referred to herein as the "first neutral position" of the transducer 10.

If a relatively small voltage is applied to the two electroplated surfaces 14 of the electroactive element 12, the electroactive element 12 will piezoelectrically expand or contract in a direction perpendicular to its opposing major faces 12*a* and 12*b*, depending on the polarity of the voltage being applied. Because of the relatively greater combined tensile strength of the laminate layers (i.e. the second aluminum layer 22, the second and third adhesive layers, and the spring member 26) bonded to one side of the electroactive element 12 than on the other (i.e. the first adhesive layer 66 and the first aluminum layer), piezoelectric longitudinal expansion of the electroactive element 12 causes the radius of the curvature R1 of the transducer 10 to become smaller. Conversely longitudinal contraction of the electroactive element 12 causes the transducer 10 to flatten out (i.e. the radius of curvature R1 of the transducer becomes larger). Thus it will be understood that the radius of curvature R1 of the transducer can be slightly increased or decreased (depending on the polarity of the applied voltage) by applying a small voltage to the transducer 10 from the voltage source 30 via wires 28 and 29.

For a transducer 10 which is initially in the "first neutral position" (as illustrated in FIG. 1) the radius of curvature can be slightly increased (i.e. causing the device to flatten out) by applying a relatively small voltage (a "first" polarity) to the electrodes 14 of the transducer. If the voltage is subsequently interrupted the transducer will once again assume (or, more accurately, be biased to assume) the "first neutral position". Similarly, for a transducer 10 which is initially in the "first neutral position" (as illustrated in FIG. 1) the radius of curvature can be slightly decreased by applying a relatively small voltage of opposite (a "second") polarity to the electrodes 14 of the transducer. If the voltage is subsequently interrupted the transducer will once again assume the "first neutral position". The "first neutral position" of the transducer 10 is characterized as being the position/configuration that the transducer 10 assumes under zero voltage input (absent the application of any external forces) whenever a plane (e.g. plane A) which intersects at least two diametrically opposed points on the perimeter 26*a* of the spring member 26 faces the concave face 10*b* of the spring member 26.

Referring now to FIG. 2: As discussed above the radius of curvature of a transducer 10 which is initially in the "first neutral position" (as illustrated in FIG. 1) can be increased (i.e. causing the device to flatten out) by applying a voltage (having a first polarity) to the electrodes 14 of the transducer. Within limits which will be discussed below, the amount of deformation (i.e. "flattening out") of the transducer generally varies proportionally with the magnitude of the voltage applied to the transducer. If sufficient voltage is applied to a transducer 10 which is initially in the first neutral position, the transducer can be made to flatten out, until it is in the position/configuration illustrated in FIG. 2. The position/configuration of the transducer 10 illustrated in FIG. 2 is referred to herein as the "toggle position" of the transducer. The "toggle position" of the transducer 10 is characterized as a unique and inherently unstable position/configuration (FIG. 2) which the transducer 10 may assume, intermediately between a first neutral position (FIG. 1) and a second neutral position (FIG. 3), wherein the transducer is equally biased to assume either of said neutral positions upon cessation of voltage input to the transducer. In the case of a transducer 10, initially in the first neutral position, which becomes flattened out so as to assume the "toggle position" illustrated in FIG. 2 as a result of applied voltage, any additional voltage applied to the transducer will cause the device to pass through the toggle position and thereby become biased to assume a second neutral position (FIG. 3) upon cessation of voltage input to the transducer.

It will be understood that the "toggle position" is an inherently unstable position/configuration for the transducer 10. While in the "toggle position" the perimeter of the spring member 26*a* is subjected to high tensile (e.g. hoop) stresses which result from its being "flattened out" in the above-described manner. In particular, the tensile (e.g. hoop) stresses in the perimeter 26*a* of the spring member reach a maximum when the spring member 26 is in the "toggle position" (i.e. is substantially flat), as illustrated in FIG. 2.

Figure 3:
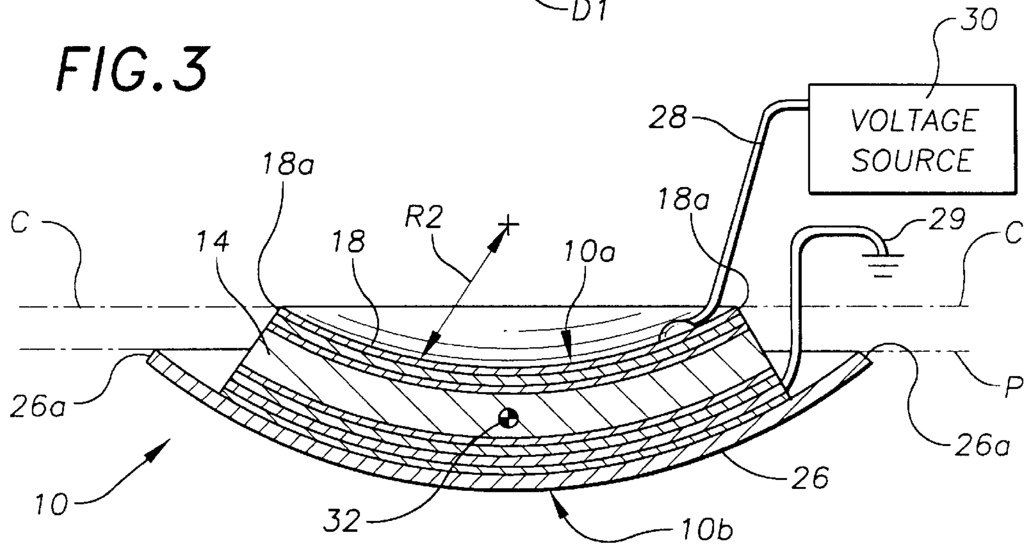
FIG. 3 is a medial cross-sectional view of the transducer used in the present invention, shown in a second neutral position.

Referring now to FIG. 3: Once the transducer has reached the "toggle position" (having initially been in the first neutral position), a relatively slight additional voltage input (having a first polarity) will cause additional elongation of the electroactive element 14 which, in turn, causes the exposed face 10*b* of the spring member 26 to become convex. As soon as the spring member 26 is deformed slightly beyond the "toggle position" to one in which the exposed face 10*b* of the spring member 26 becomes slightly convex, the entire transducer rapidly deforms, with the radius of curvature R2 of the exposed surface 10*a* of the transducer becoming smaller. It will be understood that by decreasing the radius of curvature R2 of the exposed surface 10*a* of the transducer, the length of the perimeter 26*a* of the spring member 26 is reduced, which reduces the tensile (e.g. hoop) stress in the spring member 26 at its perimeter 26*a*.

If the voltage is subsequently interrupted the transducer will assume the "second neutral position", as illustrated in FIG. 3. The "second neutral position" of the transducer 10 is characterized as being the position/configuration that the transducer 10 is biased to assume under zero voltage input whenever a plane C intersecting at least two diametrically opposed points on the perimeter 18*a* of the aluminum layer 18 faces the concave exposed face 10*a* of the first aluminum layer 18 of the transducer 10, as illustrated in FIG. 3.

Once the transducer is in the "second neutral position", the radius of curvature R2 of the device can be slightly increased (i.e. causing the device to flatten out) by applying a relatively small voltage (having a second, i.e. opposite, polarity) to the electrodes 14 of the transducer. If the voltage is subsequently interrupted the transducer will once again assume the "second neutral position". Similarly, for a transducer 10 which is initially in the "second neutral position" (as illustrated in FIG. 1) the radius of curvature can be slightly decreased by applying a relatively small voltage of the opposite (i.e. "first") polarity to the electrodes 14 of the transducer. If the voltage is subsequently interrupted the transducer will once again assume the "second neutral position". As discussed above the radius of curvature of a transducer 10 which is initially in the "second neutral position" (as illustrated in FIG. 3) can be increased (i.e. causing the device to flatten out) by applying a voltage to the electrodes 14 of the transducer. Within limits, the amount of deformation (i.e. "flattening out") of the transducer generally varies proportionally with the magnitude of the voltage applied to the transducer. If sufficient voltage (at a "second" polarity) is applied to a transducer 10 which is initially in the second neutral position, the transducer can be made to flatten out until it is in the "toggle position" of the transducer. It should be noted that the transducer may be exposed to physical forces, in addition to aforementioned electrical forces, to cause the transducer to toggle between the first and second neutral positions.

Again referring now to FIG. 1: Once the transducer has reached the "toggle position" (having initially been in the second neutral position), a relatively slight additional second polarity voltage input will cause additional elongation of the electroactive element 14 which, in turn, causes the exposed face 10*b* of the spring member 26 to become concave. As soon as the spring member 26 is deformed slightly beyond the "toggle position" to one in which the exposed face 10*b* of the spring member 26 becomes slightly concave, the entire transducer rapidly deforms, with the radius of curvature R1 of the exposed surface 10*a* of the spring member 26 of the transducer becoming smaller. It will be understood that by decreasing the radius of curvature R1 of the exposed surface 1ba of the transducer, the length of the perimeter 26*a* of the spring member 26 is reduced, which reduces the tensile (hoop) stress in the spring member 26 at its perimeter 26*a*.

The preceding discussion describes the preferred embodiment of the transducer wherein the device has two inherent "neutral" positions/configurations (i.e. as illustrated in FIGS. 1 and 3) which the device is biased to assume whenever electrical power to the device is switched off, and an inherently unstable "toggle position" approximately midway between the two neutral positions (as illustrated in FIG. 2). Because in the preferred embodiment of the invention there are two such "neutral positions/configurations", the preferred embodiment of the transducer is called a "bistable" device. In a bistable device constructed in accordance with the present invention, the particular neutral position which the device is biased to assume whenever power is turned off, is that neutral position which is closest to the configuration of the device at the time the power is cut off.

It will be appreciated by those skilled in the art that in order for the transducer to operate as a bistable device, the tensile (hoop) stress in the perimeter 26*a* of the spring member must be sufficiently high in any configuration of the transducer between the first and second neutral positions to overcome the combined compressive forces of the various laminate layers (12, 14, 16, 18, 20, 24, 26) of the transducer.

In order to assure proper operation of the snap action transducer 10, it is necessary that the laminated structure be manufactured such that, in all positions/configurations between the first neutral position (FIG. 1) and the second neutral position (FIG. 3) the entire cross-sectional area of electroactive element 12 remains in net compression. It will be appreciated by an understanding of the foregoing disclosure that the electroactive element is subjected to a minimum net compressive stress when the transducer is in the first neutral position (as illustrated in FIG. 1).

It will be understood that in order to ensure proper operation of the snap-action transducer the material and dimensions of the spring member 26 must be such that when the spring member 26 may be deformed throughout the range from the first neutral position (FIG. 1) to the second neutral position (FIG. 3) without the spring member's 26 being strained beyond its elastic limit.

Although the first and second aluminum layers 18 and 22 provide some pre-stressing to the electroactive element 12, the principal function of those layers is to provide an electrically conductive material by which the electrical energy may be applied uniformly to the electroplated surfaces 14 of the electroactive element 12. In some instances the adhesive layers may comprise electrically insulating materials, in which cases it is advantageous to roughen the faces of the aluminum layers 18 and 22 which face the respective electroplate surfaces 14 so as to facilitate and maintain physical contact between the aluminum layers and the electroplated surfaces.

It will be understood from the foregoing disclosure that a snap action piezoelectric transducer constructed in accordance with the present invention provides a unique transducer in which the amount of strain (output) from the device does not vary linearly with the voltage applied (input) to the electrodes within operating range of strain of the device; and in which the rate at which the device becomes strained does not vary linearly with the rate at which the input voltage to the device is changed.

By way of example only, snap action transducers constructed in accordance with the present invention may be used in place of prior solenoid-type switches, actuators, and the like. The bistable configuration has the additional advantage (for example over prior solenoid-type switches and actuators) of being able to assume the nearest of either of two neutral positions/configuration whenever power to the device is cut off, and the device will continue to assume that position even without additional power input.

While the above description of the snap-action transducer 10 contains many specificities, these should not be construed as limitations on the scope of the invention, but rather as an exemplification of one preferred embodiment thereof. Many other variations are possible, for example:

The voltage source 30 may be electrically connected to the transducer with any common form of electric conductor, and need not comprise a wire (28, 29) as described for the preferred embodiment of the invention;

The first aluminum layer 18 may be omitted, in which case electrical energy from the voltage source 30 must be applied directly to an electrode 14 of the electroactive element;

The adhesive layers 16, 20 and 24 may be made of other mechanically strong adhesives such as a polyimides, thermoplastics, thermosets and braze alloys;

The electroactive element 12 may be a piezostrictive material, piezoelectric material, or a composite;

The spring member may comprise any metal of high tensile strength and a high modulus of elasticity, including spring steel and other metals;

At the beginning of the manufacturing process (i.e. prior to simultaneously heating the laminate layers of the structure), the electroactive element 12 and/or the spring member 26 may be "pre-curved" rather than flat members;

The electrical conductors (i.e. wires 28, 29) may be attached to the device by various common means including soldering, or brazing, and gluing, etc.;

The electrical conductors (i.e. wires 28, 29) may either be attached to the aluminum layers (18, 22) or they may alternatively be attached directly to the electroplated surfaces 14 of the electroactive element 12;

The perimeters of the respective laminate layers (i.e. 12, 14, 16, 18, 20, 22, 24 and 26) may either be flush with each other or, alternatively, they may be staggered or uneven;

The "dome" shape of the device may be a spherical segment, a parabolic segment or other three-dimensional regular curved segment;

The various layers of which the transducer is comprised may be sizes and shapes other than those given with respect to the preferred embodiment of the invention;

One or more additional pre-stressing layer may be similarly adhered to either or both sides of the ceramic layer 67 in order, for example, to increase the stress in the ceramic layer 67 or to strengthen the actuator 12;

The snap-action transducer may be manufactured by placing initially dome-shaped laminate layers (12, 18, 22 and 26) in nesting relationship with each other, (for example as shown in FIG. 1 or FIG. 3), prior to the step of heating and subsequently cooling the materials, rather than starting with initially flat/disc-shape laminate layers as shown in FIG. 2.

Ground Fault Circuit Interrupter

With reference to FIGS. 6–9, now will be described the construction and operation of the preferred embodiment of a GFIC device 70 comprising a snap-action transducer 10 constructed in accordance with the foregoing description.

In the preferred embodiment of the invention the GFIC 70 is in the form of an electrical receptacle, as illustrated in FIGS. 6–9. It should be noted, however, that the present invention may be constructed in other embodiments, such as circuit breakers (to create ground fault circuit interrupter circuit breakers) or other ground fault protective devices, and, accordingly, may be configured in forms other than electrical receptacles.

Figure 6:
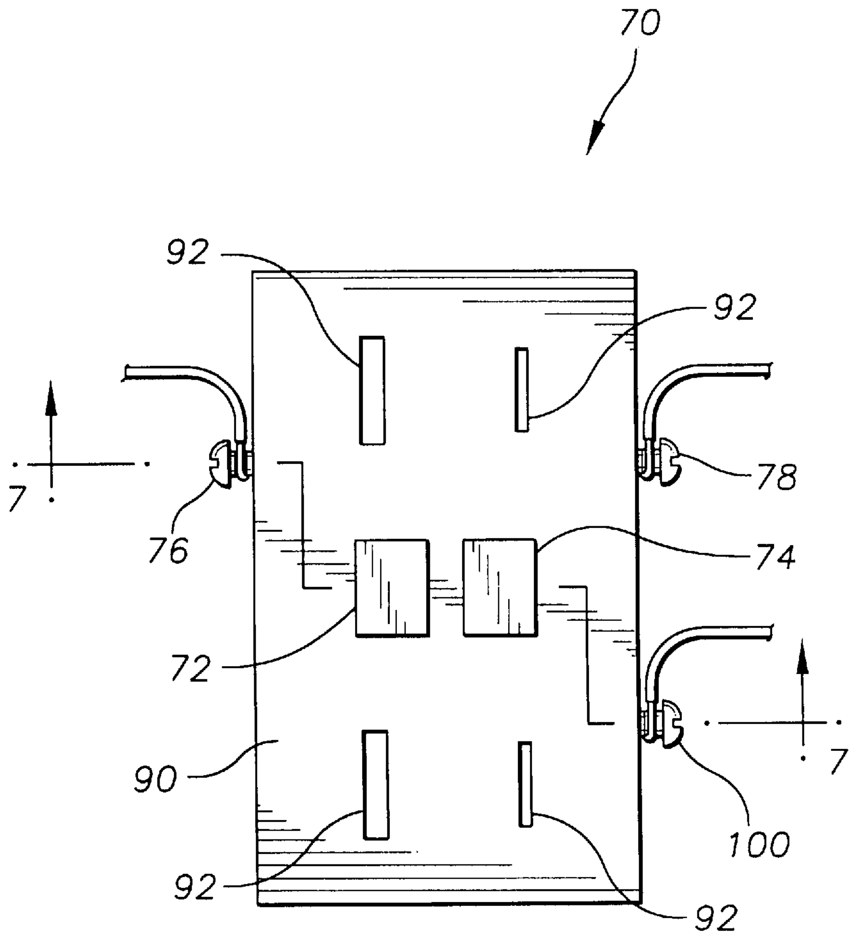
FIG. 6 is an elevation view of the preferred embodiment of this invention.
Figure 7:
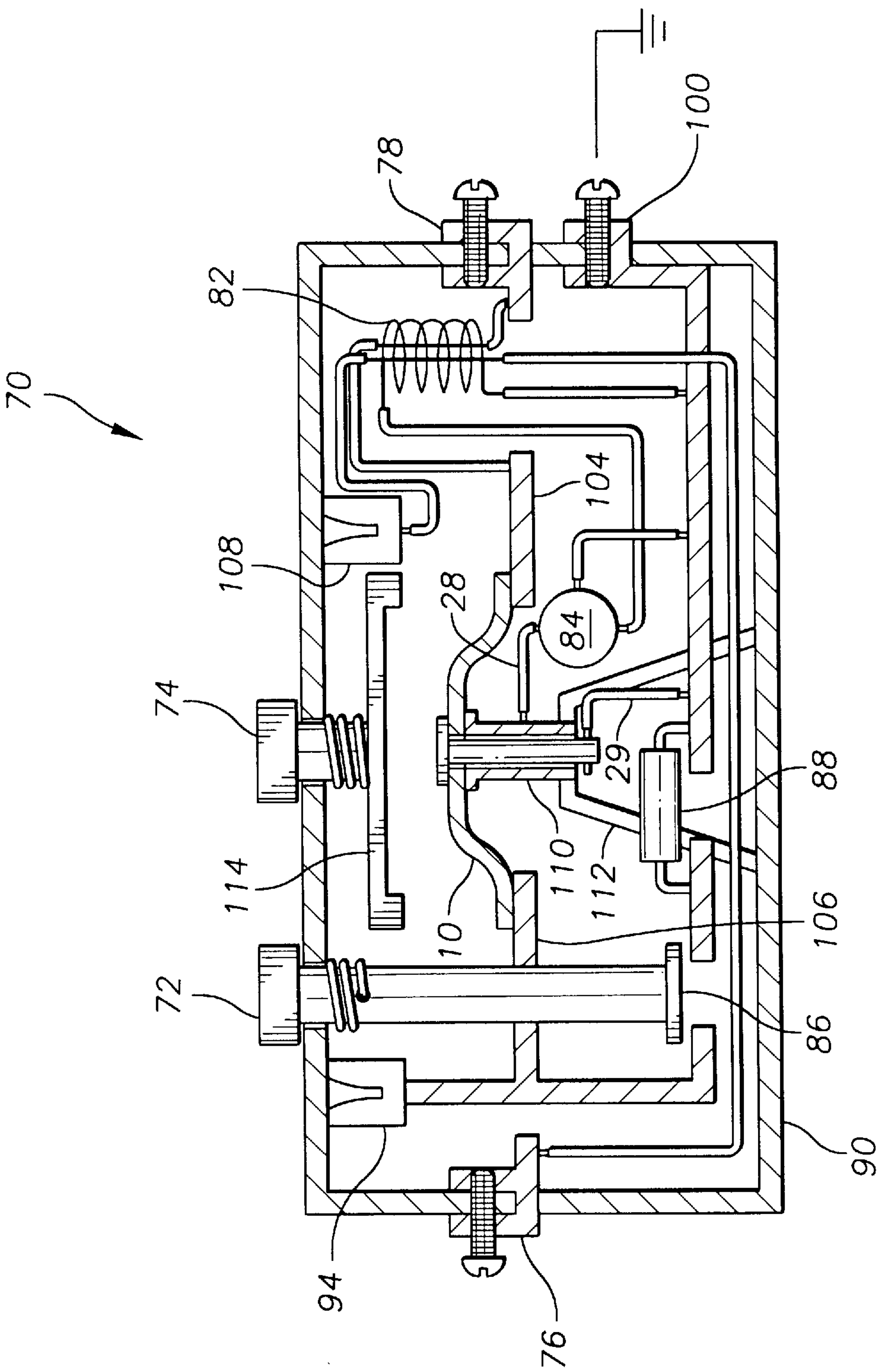
FIG. 7 is a cross-sectional view taken along the line 7—7 of FIG. 6, showing the transducer in the "closed" or normal operating position.

As illustrated in FIGS. 6 and 7, an electrically insulated housing 90 has at least one pair of openings 92, communicating with female electrical socket connectors 94 or 98 adapted to receive an electrical plug 96 of a detachable electrical load 98. Leading from the exterior of the housing 90 to its interior are three electrical conductors: a "hot" conductor 78, a "neutral" conductor 76, and a "ground" conductor 100.

The hot conductor 78 is adapted to be connected to an electrical power supply 102. The hot conductor 78 passes through the core of an electrical coil 82 and to a first terminal 104 of a switch comprising a snap-action transducer 10. The snap-action transducer 10 switch comprises an electrically conductive layer (e.g. spring member 26, as illustrated in FIGS. 1–5) which is adapted to alternately engage and disengage the first terminal 104 and a second terminal 106. The second terminal 106 is electrically connected to an electrical socket connector 94, which is one of two such connectors (94 and 108) which are adapted to receive an electrical plug connected to a removable electric load 98. When the snap-action transducer 10 switch is in the "closed" position, as illustrated in FIG. 7, the socket connector 94 is electrically connected to the "hot" conductor 78 via the snap-action transducer 10 switch.

The neutral conductor 76 passes through the core of the electrical coil 82 and thence to a second electrical socket connector 108 which is adapted to receive an electrical plug connected to a removable electric load 98.

Referring again to FIGS. 7 and 8: A coaxial post 110 is rigidly attached to the housing 90 by a post support member 112. The post 110 is attached to the snap-action transducer 10 switch at its approximate center, such that the snap-action transducer 10 switch's perimeter may axially move (with respect to the central post 110) when electrically energized.

Under "normal" conditions (i.e. when a ground fault condition is not present) the snap-action transducer 10 switch 10 is normally in the "closed" position, as illustrated in FIG. 7. When a ground fault condition is not present, current flow into and out of the device are equal. More specifically, when a ground fault condition is not present, there is no net current flow through the core of the electric coil 82. When there is no net current flow through the core of the electric coil 82, there is no induced voltage in the coil 82. When there is no induced voltage in the coil 82, there is no voltage applied to the electrode of the snap-action transducer 10 switch, and, consequently, the snap-action transducer 10 switch remains in its normally "closed" position. Accordingly, under "normal" conditions, the snap-action transducer 10 switch is closed, and the hot 78 and neutral 76 conductors are in direct electrical communication with the electrical socket connectors 94 and 108, respectively.

When a ground fault condition is present, it is desirable for the fault condition to be sensed and for the snap-action transducer 10 switch to open, thereby interrupting current flow through the hot conductor 78 to the electrical socket connector 94. As previously discussed, both the hot 78 and neutral 76 conductors pass through the core of an electric coil 82. One end of the coil 82 is connected to ground. The other end of the coil 82 is connected to an IBJT transistor 84. The transistor 84 is additionally connected (for example via coaxial post 110) to an electrode on one of the major faces of the snap-action transducer 10 switch. The electrode on the opposite major face of the snap-action transducer 10 switch is connected to ground (for example via coaxial post 110).

Figure 8:
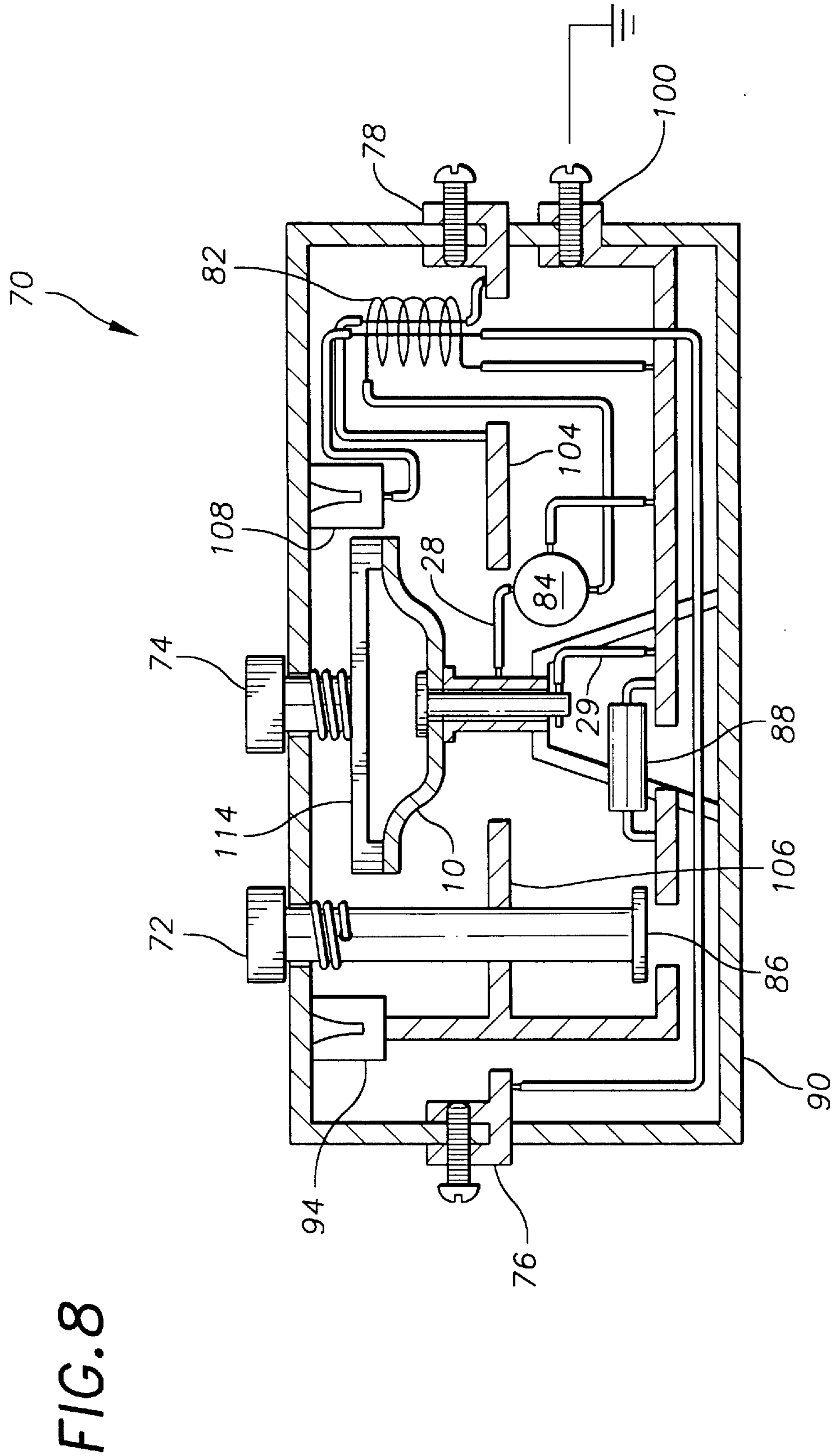
FIG. 8 is a cross-sectional view similar to FIG. 7, but showing the transducer in the "open" or ground fault detected position.
Figure 9:
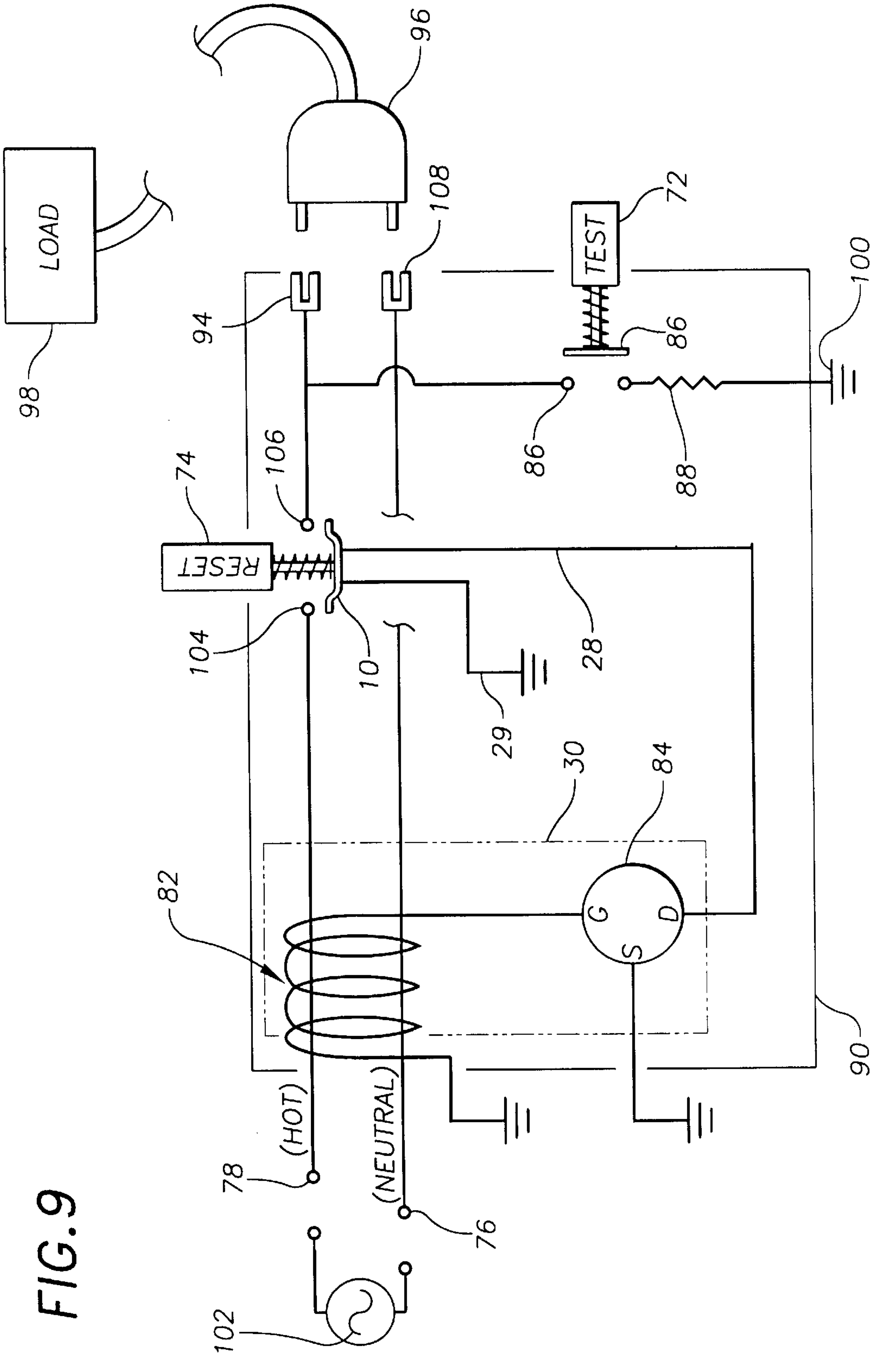
FIG. 9 is an electrical schematic of the preferred embodiment of this invention.

When a ground fault condition exists, an imbalance of magnetic flux is present within the core of the electric coil 82 because the magnitude of the current flow through the hot conductor 82 does not equal the magnitude of the current flow through the neutral conductor 76. The imbalanced magnetic flux induces a voltage on the coil 82. The voltage induced on the coil 82 turns on an IBJT transistor 84 which amplifies the turn-on voltage and energizes the snap-action transducer 10 switch. The energized snap-action transducer 10 switch is piezoelectrically strained until it "snaps" into a second neutral or "open" position (as illustrated in FIG. 8) in the manner described herein above with respect to FIGS. 1–5. When the snap-action transducer 10 switch is in the "open" position, as illustrated in FIG. 8, the circuit between the supply conductor 107 and the load is open, thus protecting any person who may be in contact with the load from electrical shock.

After the ground fault condition is corrected the user may then press the reset button 74. When the reset button 74 is pressed, it moves a reset bracket 114 which engages snap-action transducer 10 switch, and mechanically causes the snap-action transducer 10 switch to assume the first neutral (i.e "closed") position as shown in FIG. 7.

A test circuit is preferably provided to allow the user to create a short circuit and test the operating condition of the GFIC 70. When a user pushes the test button 72 it closes the test switch 86, thereby creating a ground fault condition by allowing current to flow from the hot conductor 78 through a test resistor 88 to ground 100. If the device is operating correctly, the ground fault condition will be sensed in the manner described herein above, the snap-action transducer 10 switch will piezoelectrically open, and current flow through the GFIC 70 will be interrupted. The user may then reset the GFIC 70 by pushing the reset button 74 in the manner described above.

While the above description contains many specificities, these should not be construed as limitations on the scope of the invention, but rather as an exemplification of one preferred embodiment thereof. Many variations are possible, for example:

The spring member (26) can be other than metallic and may be electrically non-conductive; and The snap action piezoelectric switch (10) may operate an electrically conductive element which may serve as the electrical conductor (between terminals 104 and 106), rather than the spring member (26) serving the dual functions of mechanical spring and electrical conductor.

Accordingly, the scope of the invention should be determined not by the embodiment illustrated, but by the appended claims and their legal equivalents.

We claim:

1. A ground fault interrupter device comprising:

a first electrical conductor;

sensing means in communication with said first electrical conductor for sensing a ground fault condition in said first electrical conductor, wherein said sensing means comprises means for generating a first electrical signal;

amplifier means, in communication with said sensing means, for electrically amplifying said first electrical signal to become a second electrical signal;

switching means, in electrical communication with said amplifier means, for temporarily opening said first electrical conductor between a first terminal and a second terminal;

wherein said switching means comprises a deformable piezoelectric member;

said piezoelectric member having a first electrode and a second electrode;

said first electrode being in electrical communication with said amplifier means;

said switching means further comprising an electrically conductive prestress layer bonded to said deformable piezoelectric member, wherein said prestress layer applies a compressive stress to said deformable piezoelectric member;

wherein said electrically conductive prestress layer is adapted to be in temporary contact with said first terminal and said second terminal;

and wherein said piezoelectric member is adapted to sufficiently piezoelectrically deform when energized by said second electric signal to cause said electrically conductive prestress layer to disengage said first terminal or said second terminal.

2. The device according to claim 1, wherein said electroactive transducer is a bistable device.

3. The device according to claim 1, wherein said piezoelectric member is adapted to sufficiently piezoelectrically deform when energized by said second electric signal to cause said electrically conductive prestress layer to disengage said first terminal and said second terminal.

4. A circuit breaking device, comprising:

a first electrical conductor, wherein said first electrical conductor is adapted to be connected to an electric power supply;

a second electrical conductor, wherein said second electrical conductor is adapted to be connected to an electric load;

switching means;

said switching means comprising a third electrical conductor disposed intermediately between said first electrical conductor and said second electrical conductor;

said third electrical conductor being detachable from said first electrical conductor or said second electrical conductor;

said switching means further comprising an electroactive transducer in mechanical communication with said third electrical conductor, said electroactive transducer further comprising;

an electroactive ceramic member having two major faces;

an electrode bonded to each of said two major faces of said electroactive ceramic member; and a pre-stress layer bonded to a major face of said electroactive ceramic member, wherein said prestress layer applies a compressive stress to said electroactive ceramic member; and energizing means for electrically energizing said electroactive transducer.

5. The device according to claim 4, wherein said electroactive transducer is a bistable device.

6. The device according to claim 5, wherein said electroactive member comprises a piezoelectric material.

7. The device according to claim 6, further comprising a fourth electrical conductor having a first end and a second end, said first end of said fourth electrical conductor being adapted to be connected to said electric power supply, and said second end of said fourth electrical conductor being adapted to be connected to said electric load.

8. The device according to claim 7, wherein said energizing means comprises:

sensing means for sensing electrical current flow through said first electrical conductor;

and amplifying means, in communication with said sensing means;

and further comprising a fifth electrical conductor electrically connecting said amplifying means and one of said electrodes.

9. The device according to claim 8, wherein said sensing means comprises a sixth electrical conductor, said sixth electrical conductor being connected to said amplifying means;

wherein said sixth electrical conductor comprises an electric coil;

and wherein a portion of said first electrical conductor extends axially through said electric coil.

10. The device according to claim 9, wherein a portion of said 4th electrical conductor extends axially through said electric coil.

11. The device according to claim 10, wherein said prestress layer comprises a normally curved spring member.

12. The device according to claim 11, wherein said spring member is dome-shaped.

13. A circuit breaking device, comprising:

a first electrical conductor, wherein said first electrical conductor is adapted to be connected to an electric power supply;

a second electrical conductor, wherein said second electrical conductor is adapted to be connected to an electric load;

switching means, said switching means comprising an electrically conductive electroactive transducer disposed intermediately between said first electrical conductor and said second electrical conductor, said electroactive transducer being detachable from said first electrical conductor or said second electrical conductor, said electroactive transducer further comprising;

an electroactive ceramic member having two major faces;

an electrode bonded to each of said two major faces of said electroactive ceramic member; and a pre-stress layer bonded to a major face of said electroactive ceramic member, wherein said pre-stress layer applies a compressive stress to said electroactive ceramic member; and energizing means for electrically energizing said electroactive transducer.

* * * * *